United States Patent [19]

Kikuchi

[11] Patent Number: 4,630,000
[45] Date of Patent: Dec. 16, 1986

[54] APPARATUS FOR CONTROLLING THE FREQUENCY OF A VOLTAGE CONTROLLED OSCILLATOR

[75] Inventor: Akihiro Kikuchi, Chiba, Japan

[73] Assignee: Sony Corporation, Tokyo, Japan

[21] Appl. No.: 652,094

[22] Filed: Sep. 19, 1984

[30] Foreign Application Priority Data

Sep. 21, 1983 [JP] Japan .................................. 58-174777
Sep. 21, 1983 [JP] Japan .................................. 58-174778

[51] Int. Cl.$^4$ .......................... H03L 7/08; H04N 5/04
[52] U.S. Cl. ........................................ 331/11; 331/17; 331/20; 331/27; 358/159
[58] Field of Search ....................... 331/17, 20, 25, 27, 331/10, 11; 358/330, 159

[56] References Cited

U.S. PATENT DOCUMENTS 3,458,823  7/1969  Nordahl ............................ 331/11 X
3,821,470  6/1974  Merrell ............................. 331/20 X
4,490,749 12/1984  Hirota .............................. 358/330 X

*Primary Examiner*—Siegfried H. Grimm
*Attorney, Agent, or Firm*—Lewis H. Eslinger; Alvin Sinderbrand

[57] ABSTRACT

Apparatus for controlling the frequency of a voltage controlled oscillator in response to a horizontal synchronizing signal of a video signal comprises a frequency divider for dividing the frequency of the output of the oscillator and a control for phase-comparing the output of the frequency divider with the horizontal synchronizing signal and controlling the frequency of the oscillator in response to the result of the phase comparison. The control comprises a circuit for forming a control signal by using a first pulse signal having a first signal level and a second pulse signal having a second signal level in response to the phase difference between the horizontal synchronizing signal and the output of the oscillator. A correcting signal is added to the control signal when the phase of the horizontal synchronizing signal is beyond a predetermined range.

5 Claims, 28 Drawing Figures

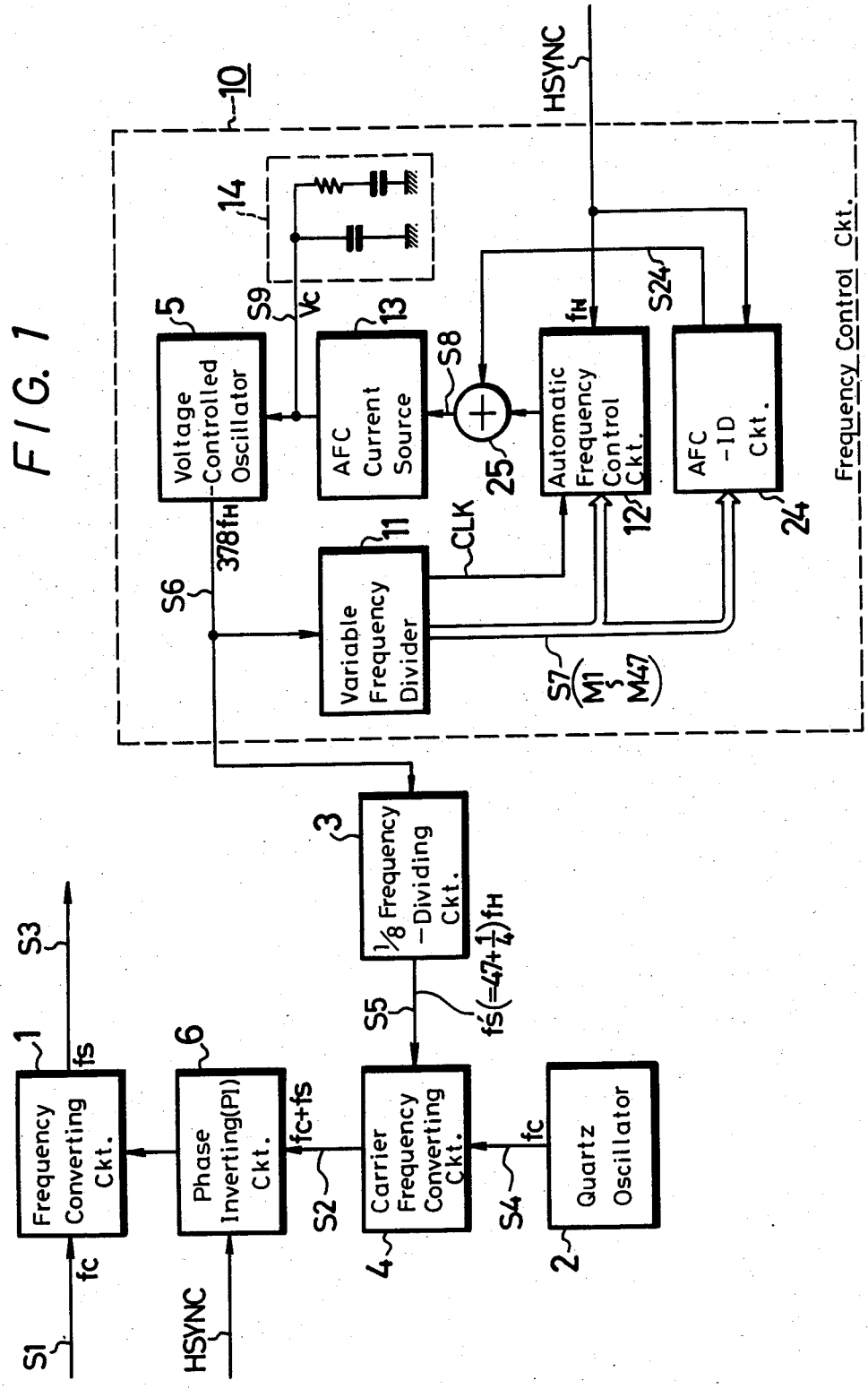

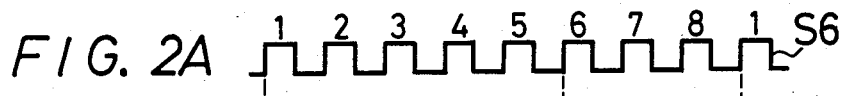
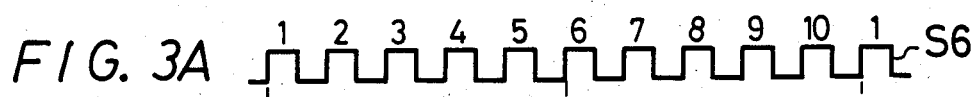
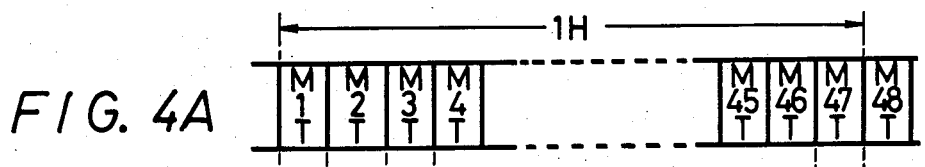

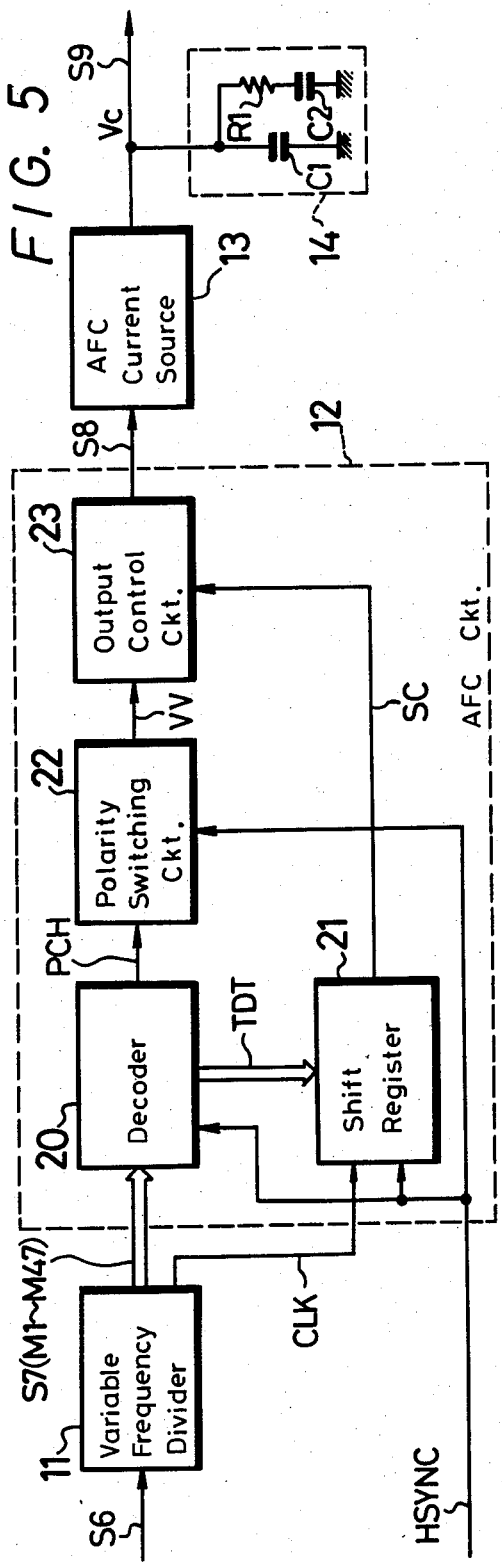
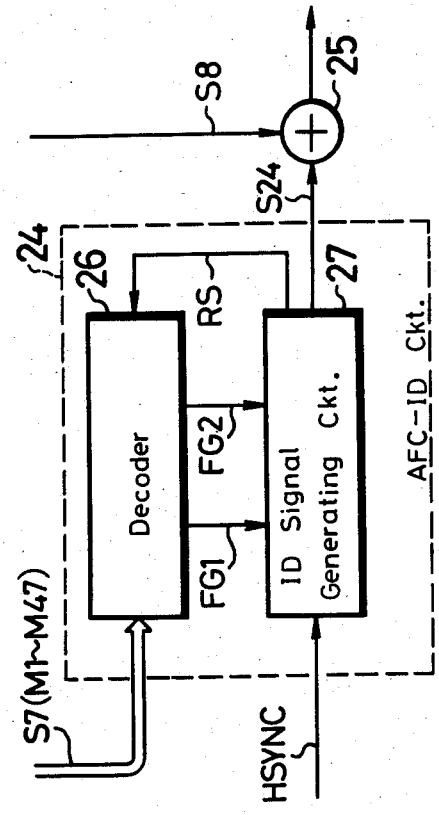

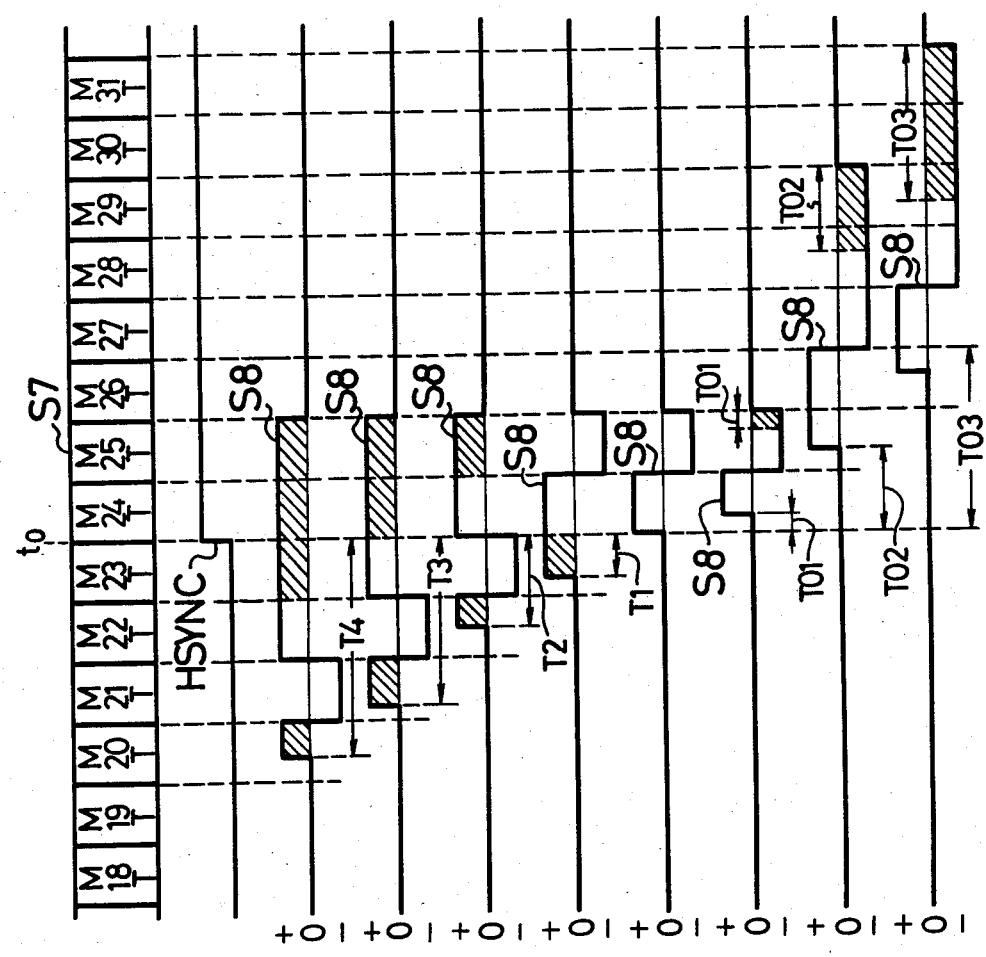

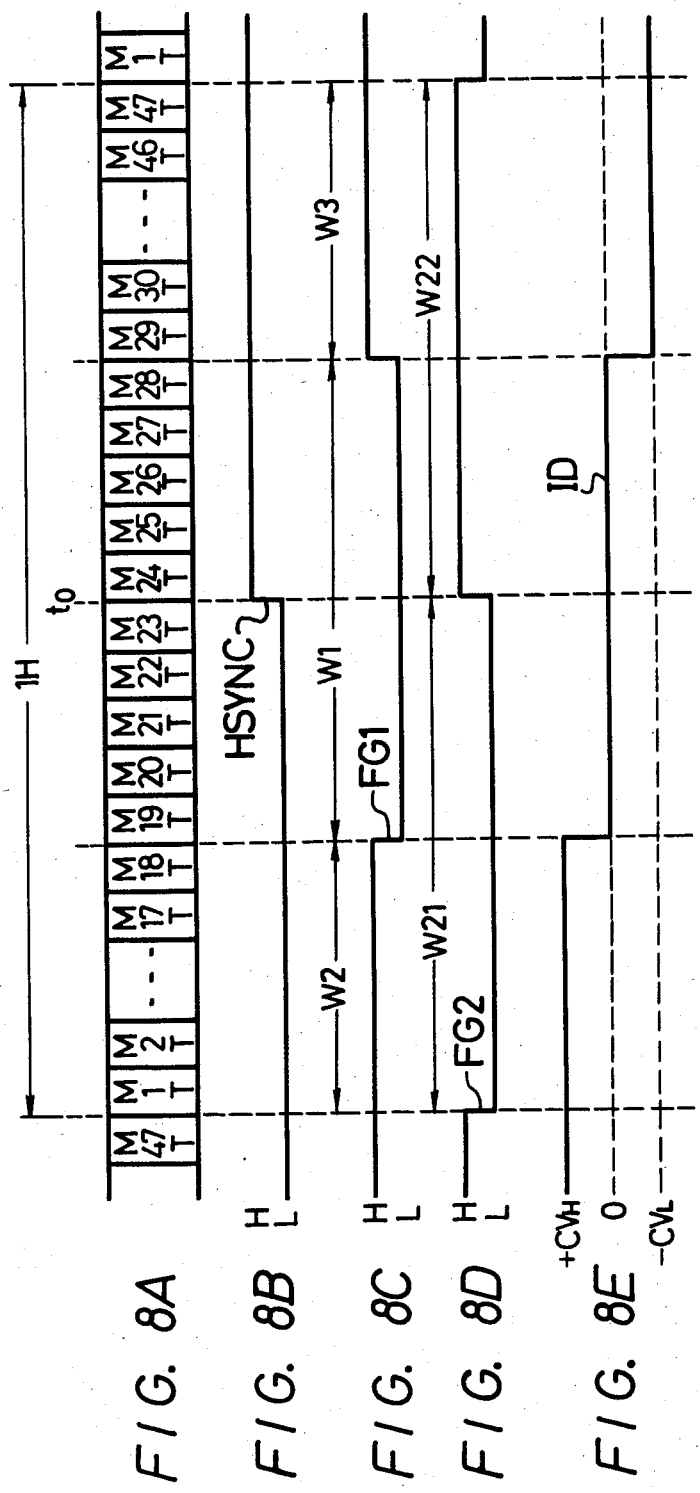

APPARATUS FOR CONTROLLING THE FREQUENCY OF A VOLTAGE CONTROLLED OSCILLATOR

BACKGROUND OF THE INVENTION

1. Field of the Invention

This invention relates to frequency control circuits for a video signal and more particularly to an apparatus for controlling the frequency of a voltage controlled oscillator for use in, for example, a video tape recorder (VTR).

2. Description of the Prior Art

In the color signal processing circuit of a VTR, a carrier chrominance signal (with frequency of 3.58 MHz) is frequency-converted to a low frequency converted chrominance signal (with frequency fs=743 KHz) and then recorded on a magnetic tape, while upon playback, the reproduced low frequency converted chrominance signal is frequency-converted to a reproduced carrier chrominance signal (with frequency fc=3.58 MHz), thus making the usable frequency band narrow. In the prior art of the frequency conversion like the above, a VCO (voltage controlled oscillator) is frequency-controlled on the basis of a horizontal sync (synchronizing) signal separated from an input video signal and the frequency conversion is carried out by the frequency output signal derived from the VCO which is controlled as above; thus, the frequency converted output can be produced on the basis of the frequency signal which is locked in the frequency of the horizontal synchronizing signal. This frequency control circuit is a so-called AFC (automatic frequency control) circuit.

When the VCO is used to carry out the frequency conversion by the use of the frequency signal locked in the frequency of the horizontal synchronizing signal, if the frequency variable range of the VCO is wide, for example, the oscillation frequency of the VCO is largely different from the frequency of the horizontal synchronizing signal, upon starting, the oscillation frequency of the VCO may fail to lock onto the frequency of the horizontal synchronizing signal. To remove this shortcoming, it is proposed in the prior art to use a VCO which is adjusted so that its frequency variable range is set within a predetermined narrow range.

However, with such previously proposed VCO, when it is formed on an IC (integrated circuit), if the parameter thereof is scattered, the change of the oscillation frequency of the VCO can not be restricted within a predetermined range so that the manufacturing yield thereof inevitably grows worse.

OBJECTS AND SUMMARY OF THE INVENTION

It is an object of this invention to provide an improved frequency control circuit.

It is another object of this invention to provide a frequency control circuit suitable for use in a video tape recorder.

It is a further object of this invention to provide a frequency control circuit suitable for being formed as an integrated circuit.

It is a still further object of this invention to provide a frequency control circuit capable of carrying out the automatic frequency control operation with high precision.

It is a yet further object of this invention to provide a frequency converting circuit in which even when a frequency of a voltage controlled oscillator is changed in a wide variety of range, its oscillation frequency can easily be locked in the frequency of a horizontal synchronizing signal.

In one aspect of this invention, a first pulse signal having a first signal level is produced in synchronism with a horizontal synchronizing signal and a second pulse signal having a second signal level is produced in synchronism with an oscillation frequency output signal of a voltage controlled oscillator. Then, the first and second pulse signals are used in turn to form a control signal for the voltage controlled oscillator so that when the phase of the horizontal synchronizing signal is advanced relative to the reference phase of the oscillation frequency output signal of the voltage controlled oscillator, the pulse width of the first pulse signal is expanded in response to the amount of the phase advance, while when the phase of the horizontal synchronizing signal is delayed relative to the reference phase of the oscillation frequency output signal of the voltage controlled oscillator, the pulse width of the second pulse signal is expanded in response to the amount of the phase delay.

In another aspect of this invention, a correcting signal generating circuit is provided to generate a correcting signal of a predetermined level when the phase of the horizontal synchronizing signal is displaced or shifted by a predetermined amount relative to the frequency-divided output of the oscillation frequency output signal from the voltage controlled oscillator. Thus, when the control signal for the voltage controlled oscillator is corrected by this correcting signal, the voltage controlled oscillator is locked in the frequency of the horizontal synchronizing signal.

The other objects, features and advantages of the present invention will become apparent from the following description taken in conjunction with the accompanying drawings through which the like references designate the same elements and parts.

BRIEF DESCRIPTION OF THE DRAWINGS

FIG. 1 is a block diagram showing an embodiment of a frequency control circuit according to this invention;

FIGS. 2A, 2B, FIGS. 3A, 3B, FIGS. 4A, 4B and 4C1 to 4C47 are respectively waveform diagrams showing signals at respective parts of the frequency control circuit of the invention shown in FIG. 1;

FIG. 5 is a block diagram showing in detail an arrangement of the automatic frequency control circuit used in the circuit shown in FIG. 1;

FIGS. 6A to 6J are respectively waveform diagrams of signals used in respective circuit elements of the automatic frequency control circuit shown in FIG. 5;

FIG. 7 is a block diagram showing in detail an arrangement of an automatic frequency control identification circuit used in the circuit shown in FIG. 1; and FIGS. 8A to 8E are respectively waveform diagrams useful for explaining the operation of the automatic frequency control identification circuit shown in FIG. 7.

DESCRIPTION OF THE PREFERRED EMBODIMENT

Now, an embodiment of the frequency control circuit according to the present invention will hereinafter be described in detail with reference to the drawings. In this embodiment, the frequency control circuit of the invention is applied to an AFC (automatic frequency control) circuit used by a chrominance signal system in a recording circuit of a VTR (video tape recorder). FIG. 1 is a block diagram showing an embodiment of the frequency control circuit according to the present invention.

As shown in FIG. 1, a carrier chrominance signal S1 (with frequency fc) obtained from an input video signal supplied through an ACC (automatic chroma level control) circuit is supplied to a frequency converting circuit 1 in which it is frequency-converted to a low frequency converted chrominance signal S3 (with frequency fs) in response to a carrier signal S2. The low frequency converted chrominance signal S3 is recorded together with a luminance signal on a magnetic tape (not shown).

The carrier signal S2 results from frequency-converting an oscillation output S4 (with frequency fc) of a quartz oscillator 2 by a frequency output signal S5 (with frequency fs') derived from a $\frac{1}{8}$ frequency-dividing circuit 3. The frequency conversion is performed by a carrier frequency converting circuit 4. The carrier signal S2 is inverted in phase by a PI (phase inverting) circuit 6 and then supplied to the frequency converting circuit 1. In this connection, the carrier frequency converting operation is carried out in such a manner that interference by beat noise due to cross modulation distortion with an FM (frequency modulated) luminance signal appearing in a reproduced luminance signal is reduced by interleaving. An oscillation output S6 (with frequency 378 $f_H$) of a VCO (voltage controlled oscillator) 5 is frequency-divided by the $\frac{1}{8}$ frequency dividing circuit 3 so that the frequency fs' of the frequency signal S5 becomes $(47+\frac{1}{8}) f_H$.

In this case, the oscillation output S6 of the VCO 5 is required to have a frequency exactly 378 times the frequency $f_H$, i.e. 378 times the frequency of the horizontal synchronizing signal. To this end, a frequency control circuit 10 is constructed as follows. In the frequency control circuit 10, the frequency output signal S6 of the VCO 5 is frequency-divided by a variable frequency divider 11 and its frequency divided output S7 is compared with a horizontal synchronizing signal HSYNC (with frequency $f_H$) by an AFC (automatic frequency control) circuit 12. An AFC error signal S8 from this AFC circuit 12 drives an AFC current source 13 and controls its output current signal S9 whereby to control a voltage converting circuit 14. Then, an output voltage Vc of the voltage converting circuit 14 is supplied to the VCO 5 as the control signal thereof.

When the variable frequency divider 11 counts the pulses of the output signal S6 from the VCO 5 by 8 period amounts as shown in FIG. 2A, it produces a first output pulse M1 as a frequency-divided output S7 as shown in FIG. 2B. Then, when the variable frequency divider 11 counts the pulses of the output signal S6 by 10 period amounts as shown in FIG. 3A, the variable frequency divider 11 produces a second pulse M2 as the frequency-divided output S7 as shown in FIG. 3B. Further, each time when the variable frequency divider 11 counts the pulses of the frequency output S6 by 8 period amounts as shown in FIG. 2A, it produces third to forty seventh pulses M3 to M47, respectively as shown in FIG. 2B. Accordingly, during the periods in which 46 pulses M1, M3 to M47 (i.e., excluding the second pulse M2) are produced, the variable frequency divider 11 counts the output signal S6 by 8×46 period amounts. It also counts the output signal S6 by 10×1 period amounts when the second pulse M2 is delivered. This results in the frequency-divided output S7 having 47 pulses corresponding to the amounts of $(8 \times 46 + 10 \times 1) = 378$ periods. As a result, the total period of 47 pulses M1 to M47 becomes the period of the horizontal synchronizing signal HSYNC, namely 1 H.

The pulses M1 to M47 (FIGS. 4C1 to 4C47) thus produced are respectively supplied to the AFC circuit 12 as the 47 parallel line signals.

The reason why the output pulse M2 corresponding to 10 period amounts of the frequency output S6 is formed as the second frequency-divided output as shown in FIGS. 3A and 3B is that the oscillation frequency of the VCO 5 is selected to be 378 $f_H$ so as to process a television signal of NTSC (national television systems committee) system. On the other hand, when a television signal of CCIR (international radio consultative committee) system is processed, the oscillation frequency of the VCO 5 must be selected to be 375 $f_H$ so that when the output signal S6 is counted by 7 period amounts, the variable frequency divider 11 produces the second frequency-divided output (corresponding to FIGS. 3A and 3B); thus the frequency divider 11 functions as a variable frequency divider.

As described above, each period interval of the frequency-divided output S7 from the variable frequency divider 11 means that one horizontal period interval 1H (shown in FIG. 4A) of the horizontal synchronizing signal HSYNC is provided with time windows M1T to M47T corresponding to the output pulses M1 to M47 as shown in FIGS. 4C1 to 4C47. The AFC circuit 12 uses the time windows M1T to M47T to detect at which time windows M1T to M47T the horizontal synchronizing signal HSYNC rises up or becomes high and produces an AFC error signal S8 corresponding to the time difference between the generation of the horizontal synchronizing signal HSYNC and the predetermined time window, which is formed as shown in FIG. 5.

More particularly, the AFC circuit 12 includes a decoder 20 which receives the frequency-divided output S7 of the variable frequency divider 11. Among the time windows of the frequency-divided output S7, a starting time $t_0$ of the time window M24T is taken as a reference as shown in FIG. 6A. When the horizontal synchronizing signal HSYNC (FIG. 6B) rises up or becomes high at the reference time $T_0$, the decoder 20 (FIG. 5) judges that there is no AFC error. On the other hand, when the horizontal synchronizing signal HSYNC rises up or becomes high in a time window before or after the reference time $t_0$, the decoder 20 carries out the judgement corresponding thereto and supplies time data TDT corresponding to the judged results to a shift register 21 and also supplies a predetermined polarity order switching signal PCH to a polarity switching circuit 22. The polarity order switching signal PCH relates to the time window in which the horizontal sync signal HSYNC becomes high and to the succeeding time window.

When the horizontal synchronizing signal HSYNC becomes high at the reference time $t_0$ as shown in FIG. 6B, the decoder 20 supplies to the polarity switching circuit 22 the polarity order switching signal PCH so that a pulse of positive polarity is produced at the time window M24T and a pulse of negative polarity is produced at the succeeding time window M25T as shown in FIG. 6G. In practice, when the 24th pulse M24 is supplied to the decoder 20 from the variable frequency divider 11, it becomes logic "H" (high) level whereby the polarity switching signal PCH designates positive polarity, while when the 25th pulse M25 arrives thereat, it becomes logic "L" (low) level whereby the polarity switching signal PCH designates negative polarity. The horizontal synchronizing signal HSYNC is supplied to the polarity switching circuit 22 so that when the horizontal synchronizing signal HSYNC rises to the logic "H", the polarity switching circuit 22 supplies to an output control circuit 23 a voltage signal VV of a predetermined voltage value (for example, ±2.5 V) having a polarity designated by the polarity order switching signal PCH.

On the basis of the judgement that the horizontal synchronizing signal HSYNC rises at the reference timing t₀, the decoder 20 delivers the time data TDT of 2 bits with the logic "H" to the shift register 21, whereby during a period in which the shift register 21 carries out the shift operation twice, the shift register 21 produces an output control signal SC of logic "H" at its output terminal and then supplies this output control signal SC to the output control circuit 23. At that time, under the condition that the output control signal SC has logic "H", the output control circuit 23 is turned on to pass therethrough the voltage signal VV delivered from the polarity switching circuit 22 and deliver the passed voltage signal VV as an AFC error signal S8.

The shift register 21 receives the horizontal synchronizing signal HSYNC as a latch signal so that when the horizontal synchronizing signal HSYNC rises to logic "H", in accordance with its rising-up, the shift register 21 latches therein the time data TDT. At the same time, the shift register 21 carries out the shift operation on the basis of a clock pulse CLK which is produced from the variable frequency divider 11 each time the time window is changed. As a result, when the time data TDT is latched, the shift register 21 delivers the output control signal SC which becomes logic "H" during a period corresponding to the time windows the number of which is the same as the number of bits of the time data TDT counted from the first time window which is latched. Accordingly, in the case of FIG. 6G, since the time data TDT of two bits is latched in the shift register 21, the output control circuit 23 is turned on from the beginning of the time window M24T to the end of the succeeding time window M25T.

As mentioned above, since the voltage signal VV which becomes positive and negative sequentially is supplied to the output control circuit 23 which is turned on at the time windows M24T and M25T, the output control circuit 23 produces the AFC error signal S8 in a way that a positive pulse is produced at the time window M24T and a nagative pulse is produced at the succeeding time window M25T.

As shown in FIG. 5, the voltage converting circuit 14 is constructed as a parallel circuit formed of a capacitor C1 and a series circuit of a resistor R1 and a capacitor C2. The AFC current source 13 supplies a charge current to the capacitors C1 and C2 when the AFC error signal S8 has a positive polarity, while when the AFC error signal S8 has a negative polarity, the AFC current source 13 supplies a discharge current to the capacitors C1 and C2. Further, when the AFC error signal S8 is zero, the AFC current source 13 supplies no charge or discharge current to the capacitors C1 and C2. Accordingly, when the pulse widths of the positive pulse and the negative pulse are equal to each other as shown in FIG. 6G, the current flowing into the capacitors C1 and C2 becomes equal to that flowing out of the capacitors C1 and C2, so that the charged voltages in the capacitors C1 and C2 become zero as a whole. Thus, the AFC current source 13 and the voltage converting circuit 14 carry out a so-called charge pump operation.

As described above, when the rising edge of the horizontal synchronizing signal HSYNC is coincident with the reference time t₀, the decoder 20 produces the time data TDT and the polarity order switching signal PCH which make the positive pulse interval and the negative pulse interval equal to each other as shown in FIG. 6G, so that the AFC error signal S8 allows the charged voltage of the voltage converting circuit 14 to become zero. As a result, the oscillation frequency of the VCO 5 (see FIG. 1) is not changed but maintains its value. On the other hand, as the rising edge of the horizontal synchronizing signal HSYNC is moved or shifted so that it occurs before the reference time t₀, in correspondence therewith, the decoder 20 produces a time data TDT and a polarity order switching signal PCH that make the pulse width of the positive pulse expand in response thereto. That is, as shown in FIG. 6F, when the rising edge of the horizontal synchronizing signal HSYNC is advanced by time T1 to the time window M23T, the decoder 20 delivers the polarity order switching signal PCH whose polarity is positive, positive and negative in the time windows M23T, M24T and M25T, respectively and makes the shift register 21 latch the time data TDT of 3 bits having an expanded logic "H" therein. Specifically, the shift register 21 allows the output control circuit 23 to produce the AFC error signal S8 the pulse width of the positive pulse of of which is expanded by the period of the time T1 from the rising edge of the horizontal synchronizing signals HSYNC (shown by hatched area in FIG. 6F). As a result, the voltage Vc of the voltage converting circuit 14 is increased by the amount corresponding to the positive pulse internal T1. At that time, the VCO 5 is controlled to make its oscillation frequency higher so that the phase of the frequency-divided output S7 from the variable frequency divider 11 is advanced and hence the reference time T₀ of the time window M24T becomes coincident with the rising edge of the horizontal synchronizing signal HSYNC. Thus, when the above condition as mentioned with reference to FIG. 6F is presented, the frequency control circuit 10 is set in the stable state as a whole.

Then, as shown in FIG. 6E, when the rise time of the horizontal synchronizing signal HSYNC is advanced relative to the reference time t₀ by time T2 and occurs within the time window M22T, the decoder 20 supplies to the polarity switching circuit 22 the polarity order switching signal PCH whose polarity is changed in the order of positive, negative, positive and positive relative to the time windows M22T, M23T, M24T and M25T respectively and supplies the time data TDT of 4 bits having an expanded logic "H" to the shift register 21. Consequently, the pulse width of the positive pulse of the AFC error signal S8 becomes equal to the period from the rise time of the horizontal synchronizing signal HSYNC to the end of the time window M22T plus the whole time width in the time windows M24T and M25T, while the pulse width of the negative pulse becomes equal to the time width in the time window M23T. Accordingly, on the whole, the pulse width of the positive pulse of the AFC error signal S8 is expanded as shown by the hatched area in FIG. 6E by an amount equal to time T2. This represents the amount of the advance of the horizontal synchronizing signal HSYNC from the reference time $t_0$. Thus, the voltage Vc of the voltage converting circuit 14 is increased by the expanded amount of the pulse width so that the oscillation frequency of the VCO5 is increased. Thus the reference time $t_0$ of the frequency-divided output S7 derived from the frequency divider 11 is locked into the rising edge of the horizontal synchronizing signal HSYNC.

Further, as shown in FIG. 6D, when the horizontal synchronizing signal HSYNC becomes high in the time window M21T, in response to time T3 from the reference time $t_0$ to the rising edge of the horizontal synchronizing signal HSYNC, the decoder 20 supplies to the polarity switching circuit 22 a polarity order switching signal PCH which designates the polarity of the signal S8 in the order of positive, negative, positive, positive and positive in the time windows M21T, M23T, M24T and M25T, respectively and makes the shift register 21 latch time data TDT of 5 bits having an expanded logic "H" therein. Accordingly, in this case, the voltage Vc of the voltage converting circuit 14 is raised by the amount corresponding to the advanced time T3.

In like manner, as shown in FIG. 6C, when the phase of the horizontal synchronizing signal HSYNC is advanced to the time window M20T, the pulse width of the positive pulse is expanded by the amount corresponding to the advanced time T4, so that the voltage Vc of the voltage converting circuit 14 is increased.

As described above, when the phase of the horizontal synchronizing signal HSYNC is advanced relative to the reference time $t_0$, the pulse width of the positive pulse of the AFC error signal S8 is expanded by the amount corresponding to the advanced time so that the voltage Vc of the voltage converting circuit 14 is raised; thus the oscillation frequency of the VCO circuit 5 is locked in the advance phase.

On the other hand, when the phase of the horizontal synchronizing signal HSYNC is delayed relative to the reference time $t_0$ and the horizontal synchronizing signal HSYNC becomes high in the interval of the time window M24T as shown for example in FIG. 6H, the decoder 20 produces polarity order switching signal PCH and time data TDT similar to those described in connection with Fig. 6G. As a result, the pulse width of the negative pulse of the AFC error signal S8 is expanded by the amount of time T01 corresponding to the delay of phase. Thus the width of the negative pulse exceeds that of the positive pulse so that the charging current amount of the capacitors C1 and C2 of the voltage converting circuit 14 is reduced by that amount, lowering the voltage Vc of the voltage converting circuit 14. Consequently, at that time, the oscillation frequency of the VCO 5 (see FIG. 1) is lowered whereby the phase of the frequency-divided output S7 from the frequency divider 11 is delayed; thus the frequency timing $t_0$ is locked onto the rising edge of the horizontal synchronizing signal HSYNC.

As shown in FIG. 6I, when the rising edge of the horizontal synchronizing signal HSYNC appears in the interval of the time window M25T and is delayed by time T02 relative to the reference time $T_0$, the decoder 20 delivers a polarity order switching signal PCH which designates a polarity in the order of positive, positive, negative, negative and negative in the time windows M25T, M26T, M27T, M28T and M29T, respectively, and then makes the shift register 21 latch therein the time data TDT of 5 bits having logic "H" to the extent present during these 5 time windows. Accordingly, an AFC error signal S8 is produced having a positive pulse during a time interval from the rising edge of the horizontal synchronizing signal HSYNC to the end of the time window M25T plus the time window M26T and a negative pulse is produced with a pulse width corresponding to the time windows M27T, M28T and M29T. As a result, in the AFC error signal S8, the pulse width of the negative pulse is expanded by an amount corresponding to the pulse width of time T02 representing the delay of the rising edge of the horizontal synchronizing signal HSYNC relative to the reference time $t_0$. Thus, the voltage Vc of the voltage converting circuit 14 is lowered by an amount corresponding to the pulse width T02 and hence the oscillation frequency of the VCO 5 is lowered proportionally. Therefore, also in this case, the frequency control circuit 10 enables the phase of the horizontal synchronizing signal HSYNC to be locked onto the oscillation output signal S6 of the VCO 5.

Further, as shown in FIG. 6J, when the rising edge of the horizontal synchronizing signal HSYNC is delayed more and appears in the interval of the time window M26T, in order to produce the AFC error signal S8 in such a way that the pulse width of the negative pulse is expanded by an amount corresponding to the delayed time T03, the decoder 20 delivers a polarity order switching signal PCH which designates a polarity in the order of positive, positive, negative, negative, negative and negative in time windows M26T, M27T, M28T, M29T, M30T and M31T, respectively. This causes the shift register 21 to latch therein time data TDT of 6 bits having the logic level "H" to the extent present during these six windows. Accordingly, also in this case, the voltage Vc of the voltage converting circuit 14 is lowered by an amount corresponding to the time delay T03 of the horizontal synchronizing signal HSYNC, so that the oscillation frequency of the VCO 5 is lowered by a corresponding amount and hence the phase of the oscillation output signal S6 can be locked onto the horizontal synchronizing signal HSYNC.

Similarly, when the rising edge of the horizontal synchronizing signal HSYNC is further delayed, dependence on the time window where the rising edge of horizontal synchronizing signal HSYNC appears, the decoder 20 produces the corresponding polarity order switching signal PCH and time data TDT by which the pulse width of the negative pulse in the AFC error signal S8 is expanded by an amount corresponding to the phase delay. Thus, the oscillation frequency of the VCO 5 is to be lowered in response thereto.

According to the circuit arrangement as described above, when the rising edge of the horizontal synchronizing signal HSYNC is advanced or delayed relative to the reference time $t_0$ of the oscillation frequency signal S6 of the VCO 5, the AFC error signal S8 is formed in such a way that the pulse width of the positive or negative pulse is expanded by the time width corresponding to the advance or delay amount. A control voltage having a magnitude corresponding to the difference in pulse width between the positive pulse and the negative pulse is thereby supplied to the VCO circuit 5. Thus, the oscillation output signal S6 of the VCO 5 is locked in phase with the horizontal synchronizing signal HSYNC.

While, in the embodiment described above, the polarity order switching signal PCH is such that it designates for each time window a positive polarity when the logic level is logic "H" and a negative polarity when the logic level is logic "L", the polarity order switching signal PCH is not limited to designating the polarity. For example, when the output from a decoder 20 is logic "H", the signal level of +5 V may be designated, while when it is logic "L", a signal level of 0 V may be designated. In this case, when the output control circuit 23 is turned off, the signal level of the AFC error signal S8 may be selected to be +2.5 V. In short, it is sufficient that the AFC error signal S8 be capable of assuming any of three signal levels. Then in accordance with the phase advance or phase delay, there are formed first pulses having a higher voltage than the center signal level and second pulses having a lower voltage than the center signal level.

In addition to the circuit arrangement described above, the frequency control circuit 10 is provided with an AFC-ID (identification) circuit 24 as shown in FIG. 1. The AFC-ID circuit 24 restricts the AFC operation of the AFC circuit 12 within a range of a predetermined number of time windows. When the rising edge of the horizontal synchronizing signal HSYNC is advanced or delayed to such an extent that it occurs outside the predetermined range, the AFC-ID circuit 24 judges that the lock-in operation by the AFC circuit 12 is impossible and then produces a correcting signal S24. This correcting signal S24 is added to the output of the automatic frequency control circuit 12 in an adding circuit 25 which is connected between the AFC circuit 12 and the AFC current source 13. This brings the rising edge of the horizontal synchronizing signal HSYNC within a tolerable lock-in range.

The AFC-ID circuit 24 described above is preferably formed as shown in FIG. 7. As shown in FIG. 7, the frequency-divided output S7 of the variable frequency divider 11 is supplied to a decoding circuit 26, provided in the AFC-ID circuit 24. In the decoding circuit, as described in connection with FIGS. 6A and 6B, the 1H period is divided into 1st to 47th time windows. These time windows are used to judge the timing within the 1H period (see also FIGS. 8A and 8B).

The decoder 26 produces a first flag signal FG1 (FIG. 8C). An interval W1 formed of 5 time windows M23T to M19T and M24T to M28T respectively before and after the reference time $t_0$ is taken as an AFC tolerable range, and advanced interval W2 and delayed interval W3 are taken as an AFC correcting range. The first flag signal FG1 becomes logic "L" level in the AFC tolerable range W1 (the time windows M19T to M28T), while it becomes logic "H" level in the AFC correcting ranges W2 (the time windows M1T to M18T) and W3 (the time windows M29T to M47T).

In addition, the decoding circuit 26 produces a second flag signal FG2 which represents the advanced or delayed phase relative to reference timing $t_0$ in the 1H period. As shown in FIG. 8D, this second flag signal FG2 takes the interval from the time windows M23T to M1T prior to the reference time $t_0$ as a phase advanced range W21 and becomes logic "L" level, while it takes the interval from the time windows M24T to M47T following reference time $t_0$ as a phase delayed range W22 and becomes logic "H" level.

These first and second flag signals FG1 and FG2 are respectively supplied to an ID signal generating circuit 27 which then generates an ID signal (see FIG. 8E) having a voltage level corresponding to the logic level of the first and second flag signals FG1 and FG2. That is, as will be clear from the combination of FIGS. 8C and 8D, during the AFC tolerable range W1, within the interval of the phase advanced range W21, the logic levels of the first and second flag signals FG1 and FG2 become "L" and "L", while within the phase delayed range W22 the logic levels of the first and second flag signals FG1 and FG2 become "L" and "H", respectively. Thus, during the tolerable range W1, the ID signal (FIG. 8E) becomes zero level. The AFC correcting range W2 exists within the phase advanced range W21 and the logic levels of the first and second flag signals FG1 and FG2 become "H" and "L", thus the ID signal (FIG. 8E) becomes positive voltage correcting level $CV_H$. Further, the AFC correcting range W3 exists within the phase delayed range W22 and the logic levels of the first and second flag signals FG1 and FG2 become "H" and "H", thus the ID signal (FIG. 8E) is lowered to negative voltage correcting level $-CV_L$.

As described above, the ID signal generating circuit 27 generates the ID signal the voltage level of which is changed in response to the change of the logic levels of the first and second flag signals FG1 and FG2. Depending on to which range in the 1H period the horizontal synchronizing signal HSYNC belongs, the ID signal generating circuit 27 delivers as the correcting signal S21 the voltage level of the ID signal at that time. More specifically, when the horizontal synchronizing signal HSYNC becomes high in the AFC tolerable range W1 (FIG. 8C), the level of the ID signal (FIG. 8E) is zero so that the correcting signal S24 becomes zero. On the other hand, when the horizontal synchronizing signal HSYNC becomes high in the AFC correcting range W2 (FIG. 8C), the level of the ID signal at that time is the positive correcting voltage level $CV_H$, so that the ID signal of positive correcting voltage level $CV_H$ is delivered from the AFC-ID circuit 24 as the correcting signal S24. Further, when the horizontal synchronizing signal HSYNC becomes high in the AFC correcting range W3 (FIG. 8C), the level of the ID signal (FIG. 8E) is the negative correcting voltage level $-CV_L$, so that the ID signal of negative correcting voltage level $-CV_L$ is delivered from the AFC-ID circuit 24 as the correcting signal S24.

Accordingly, if the horizontal synchronizing signal HSYNC becomes high within the AFC tolerable range W1, the correcting signal S24 adds the voltage of zero to the adding circuit 25, so that the AFC error signal S8 of the AFC circuit 12 is not corrected and is supplied as is through the adding circuit 25 to the AFC current source 13 (FIG. 1). Thus the AFC operation by the AFC circuit 12 is carried out.

If the horizontal synchronizing signal HSYNC becomes high within the AFC correcting range W2, the correcting signal S21 adds the positive voltage level $CV_H$ of extremely large magnitude to the adding circuit 25, so that the AFC error signal S8 supplied from the adding circuit 25 to the AFC current source 13 becomes extremely large. In consequence, the voltage Vc of the voltage converting circuit 14 is remarkably increased, so the oscillation frequency of the VCO 5 is increased remarkably and rapidly.

When the horizontal synchronizing signal HSYNC becomes high in the AFC correcting range W3, the correcting signal S21 adds the very low voltage level $-CV_L$ having negative polarity to the adding circuit 25 so that the very low AFC error signal S8 is supplied from the adding circuit 25 to the AFC current source 13. As a result, the voltage Vc of the voltage converting circuit 14 is remarkably lowered and hence the oscillation frequency of the VCO 5 is rapidly and remarkably lowered.

According to the circuit arrangement thus made, even when the rising edge (FIG. 8B) of the horizontal synchronizing signal HSYNC is displaced relative to the phase of the oscillation frequency output signal S6 of the VCO 5, if the displaced amount lies within the AFC tolerable range W1 (FIG. 8C), the AFC-ID circuit 24 produces the correcting signal S24 of zero level. As a result, the AFC error signal S8 from the AFC circuit 12 is supplied, without being corrected, to the AFC current source 13, so that the frequency control circuit 10 carries out the ordinary AFC operation.

On the other hand, under the unstable operation state such as, for example, when the power for the circuit is just switched on, if the phase of the horizontal synchronizing signal HSYNC is extremely advanced relative to the phase of the oscillation frequency output signal S6 of the VCO 5, the ID signal generating circuit 27 produces the correcting signal S24 of the positive voltage $+CV_N$ so that in the adding circuit 25, the extremely high voltage level is added to the AFC error signal S8 of the AFC circuit 12 so as to increase the oscillation frequency of the VCO 5 significantly. As a result, the phase of the horizontal synchronizing signal HSYNC is rapidly approximated to that of the oscillation frequency output signal S6 of the VCO 5. When the phase difference therebetween falls within the AFC tolerable range W the ID signal generating circuit 24 changes the level of the correcting signal S24 to zero level in correspondence therewith. Thus the frequency control circuit 10 carries out the ordinary AFC operations.

On the contrary, when the phase of the horizontal synchronizing signal HSYNC is extremely delayed relative to the phase of the oscillation frequency output signal S6 of the VCO 5, in correspondence therewith, the ID signal generating circuit 27 delivers the correcting signal S21 of negative voltage level $-CV_L$ by which the AFC error signal S8 produced from the AFC circuit 12 is remarkably lowered to be corrected in the adding circuit 25. Thus the oscillation frequency of the VCO 5 is lowered considerably. As a result, the phase of the horizontal synchronizing signal HSYNC is rapidly approximated to the phase of the oscillation frequency output signal S6 of the VCO 5. When the phase difference falls within the AFC tolerable range W1, in correspondence therewith, the ID signal generating circuit 27 changes the level of the correcting signal S24 to zero and thus the frequency control circuit 10 is set in normal AFC operation.

In the AFC-ID circuit 24 (FIG. 7), the ID signal generating circuit 27 generates a reset signal RS every 1H period to reset the decoding circuit 26. This elimates an error of the level change of the correcting signal S24 for the change of the timing of the leading edge of the horizontal synchronizing signal HSYNC.

As set forth above, according to the present invention, since in response to the phase delayed or advanced amount between the horizontal synchronizing signal and the oscillation frequency output signal of the VCO, the pulse widths of two pulses are expanded, it is possible to generate the AFC error signal by digital signal processing. Thus, it is possible to easily produce a frequency control circuit suitable for being formed as an IC (integrated circuit) and which has a high accuracy in phase lock-in operation and only a small ripple after the lock-in has been effected.

Further, according to the present invention, when the phase of the oscillation frequency output signal from the VCO is displaced beyond a range for normal AFC operation relative to the phase of the horizontal synchronizing signal, the AFC-ID circuit generates a correcting signal having an extremely large signal level in response to the direction of the displacement. The AFC error signal is corrected by the correcting signal, the oscillation frequency of the VCO is changed greatly and thus the oscillation frequency output signal of the VCO can easily be locked in phase with the horizontal synchronizing signal. Accordingly, even when a VCO having a large scattering is used (for example, when a frequency converting circuit is formed on an ID circuit having a large scattering,) the VCO can easily be forced to operate in locked-in state. Thus a frequency converting circuit can be manufactured with excellent yield.

The above description is given on a single preferred embodiment of the invention, but it will be apparent that many modifications and variations could be effected by one skilled in the art without departing from the spirit or scope of the novel concepts of the invention, so that the scope of the invention should be determined by the appended claims only.

I claim as my invention:

1. An apparatus for controlling the frequency of a voltage controlled oscillator in response to a horizontal synchronizing signal of a video signal comprising:
   frequency-divider means for dividing the frequency of the output of said oscillator and establishing a plurality of successive time windows;
   control means for phase-comparing the output of said frequency-divider means with said horizontal synchronizing signal and controlling the frequency of said oscillator in response to the result of said phase-comparison, said control means comprising means for forming a control signal by using an error signal having a first signal level and a second signal level in response to the phase difference between said horizontal synchronizing signal and the output of said oscillator; and
   means for forming a correcting signal to be added to said error signal when the phase of said horizontal synchronizing signal is beyond a predetermined range;
   said error signal assuming said first signal level in synchronism with said horizontal synchronizing signal and thereafter assuming one of said first and second signal levels in each successive time window as necessary to form said control signal so that it controls the frequency of said oscillator in accordance with the frequency of said horizontal synchronizing signal.

2. An apparatus according to claim 1, wherein said first signal level is expanded when the phase of said horizontal synchronizing signal is advanced relative to said output of said oscillator and said second signal level is expanded when the phase of said horizontal synchronizing signal is delayed relative to said output of said oscillator.

3. An apparatus according to claim 1, wherein the dividing ratio of said frequency-divider means is variable.

4. An apparatus according to claim 1, further comprising current source means to be supplied with said control signal and a voltage converting means connected between said current source means and said oscillator to perform charge pump operation.

5. An apparatus for controlling the frequency of a voltage controlled oscillator in response to a horizontal synchronizing signal of a video signal and for converting the frequency of said video signal; said apparatus comprising:

frequency-divider means for dividing the frequency of the output of said oscillator and establishing a plurality of successive time windows;

control means for phase-comparing the output of said frequency-divider means with said horizontal synchronizing signal and controlling the frequency of said oscillator in response to the result of said comparison, said control means comprising means for forming a control signal by using an error signal having a first signal level and a second signal level in response to the phase difference between said horizontal synchronizing signal and the output of said oscillator;

means for forming a correcting signal to be added to the output of said control means when the phase of said horizontal synchronizing signal is beyond a predetermined range; and means responsive to the output of said oscillator for converting the frequency of said video signal;

said error signal assuming said first signal level in synchronism with said horizontal synchronizing signal and thereafter assuming one of said first and second signal levels in each successive time window as necessary to form said control signal so that it controls the frequency of said oscillator in accordance with the frequency of said horizontal synchronizing signal.

* * * * *